United States Patent [19]

Shinohe et al.

[11] Patent Number: 4,791,470
[45] Date of Patent: Dec. 13, 1988

[54] REVERSE CONDUCTING GATE TURN-OFF THYRISTOR DEVICE

[75] Inventors: Takashi Shinohe, Kawasaki; Katsuhiko Takigami; Hiromichi Ohashi, both of Yokohama; Tsuneo Ogura, Kamakura; Masayuki Asaka, Miura, all of Japan

[73] Assignee: Kabushiki Kaisha Toshiba, Kawasaki, Japan

[21] Appl. No.: 63,752

[22] Filed: Jun. 22, 1987

Related U.S. Application Data

[63] Continuation of Ser. No. 742,272, Jun. 7, 1985, abandoned.

[30] Foreign Application Priority Data

Jun. 12, 1984 [JP] Japan .................. 59-120361
Dec. 17, 1984 [JP] Japan .................. 59-265776

[51] Int. Cl.$^4$ ........................... H01L 29/74
[52] U.S. Cl. ..................... 357/38; 357/23.4; 357/55; 357/39; 357/68; 357/86
[58] Field of Search ............... 357/38, 39, 55, 56, 357/23.4, 86, 68

[56] References Cited

U.S. PATENT DOCUMENTS

| | | | |
|---|---|---|---|
| 3,879,744 | 4/1975 | Dumas | 357/39 |
| 3,914,782 | 10/1975 | Nakata . | |
| 4,040,170 | 8/1977 | Schlegel et al. . | |
| 4,054,893 | 10/1977 | Hutson | 357/39 |
| 4,083,063 | 4/1978 | Yu | 357/38 |
| 4,243,999 | 1/1981 | Azuma et al. | 357/39 |
| 4,471,372 | 9/1984 | Tihanyi | 357/43 |
| 4,509,089 | 4/1985 | Svedberg | 357/38 |
| 4,546,401 | 10/1985 | Svedberg | 357/38 |

FOREIGN PATENT DOCUMENTS

| | | |
|---|---|---|
| 2625917 | 12/1976 | Fed. Rep. of Germany . |
| 2733060 | 2/1979 | Fed. Rep. of Germany . |
| 3109892 | 9/1982 | Fed. Rep. of Germany . |
| 51-38985 | 3/1976 | Japan . |
| 53-83475 | 7/1978 | Japan. ............. 357/39 A |
| 53-83476 | 7/1978 | Japan ............. 357/39 A |
| 53-83477 | 7/1978 | Japan ............. 357/39 A |
| 53-83478 | 7/1978 | Japan ............. 357/39 A |
| 54-53972 | 4/1979 | Japan ............. 357/39 A |
| 55-96678 | 7/1980 | Japan ............. 357/39 A |

OTHER PUBLICATIONS

IEEE Trans. on Electron Devices, ED—31, p. 1570; M. S. Adler et al; 1984.

Primary Examiner—Joseph E. Clawson, Jr.
Attorney, Agent, or Firm—Oblon, Fisher, Spivak, McClelland & Maier

[57] ABSTRACT

A reverse conducting gate turn-off thyristor device in which a gate turn-off thyristor and a reverse conduction diode are integrally formed in the same semiconductor wafer is constituted in such a manner that a part of a gate electrode is arranged in an isolation region that is sandwiched by the gate turn-off thyristor section and the reverse conduction diode section.

7 Claims, 8 Drawing Sheets

REVERSE CONDUCTING GATE TURN-OFF THYRISTOR DEVICE

This application is a continuation of application Ser. No. 06/742,272 filed on June 7, 1985, now abandoned.

BACKGROUND OF THE INVENTION

The present invention relates to an electrode structure of a reverse conducting GTO (gate turn-off thyristor) device in which a GTO and a reverse conduction diode are integrally formed in the same semiconductor wafer.

A reverse conducting GTO device is a device in which a GTO and a diode for allowing a curret to flow in the direction opposite to a forward current of this GTO are integrally formed, namely, a GTO and a reverse conduction diode for reverse conduction of the GTO are integrally formed in the anti-parallel connection state. For example, such a GTO device is disclosed in Japanese Patent Disclosure (Kokai) No. 51-38985 and the like. An example of a typical arrangement of this reverse conducting GTO device is shown in FIG. 1.

A GTO section a has a four-layer structure consisting of a p+-type first emitter layer 11, an n-type first base layer 12, a p-type second base layer 13, and an n+-type second emitter layer 14. The second emitter layer 14 is divided into a plurality of parts. A reverse conduction diode section b is constituted by an anode layer 13' consisting of the p-type layer which is common to the second base layer 13 in the GTO section a, an n-type layer 12' which is common to the first base layer 12 in the GTO section a, and an n+-type cathode layer 15. An anode electrode 18 also serves as an anode electrode of the GTO section a and a cathode electrode of the diode section b and is commonly provided for the first emitter layer 11 in the GTO section a and the n+-type cathode layer 15 in the diode section b. A cathode electrode 16 is provided on each segment part of the second emitter layer 14. A gate electrode 17 is provided on the second base layer 13 in the GTO section a. An anode electrode 19 is provided on the anode layer 13' in the diode section b. The anode electrode 19 and the cathode electrode 16 are electrically connected and have the same potentials. An isolation region c is arranged between the GTO section a and the diode section b for prevention of mutual interference between the GTO section a and the diode section b. An n+ layer 20 is formed in the isolation region c to substantially separate the second base layer 13 and the anode layer 13'. Practically speaking, the n+ layer 20 is provided to prevent both the gate electrode 17 and cathode electrode 16 in the GTO section a, from being shortcircuited through the anode layer 13' in the diode section b when a negative bias is applied. There is also a case where a groove to substantially separate the second base layer 13 and the anode layer 13' is formed in the isolation region c in place of the n+ layer 20. The cathode electrode 16, gate electrode 17 and anode electrode 18 are respectively connected to a cathode terminal K, a gate terminal G and an anode terminal A for connection with the outside.

Such a reverse conducting GTO device is used as, for instance, a main switching element in an inverter for converting a direct current to an alternating current or the like. For example, in a GTO inverter in which an output is supplied to an inductive load such as an induction motor, a diode is usually connected in anti-parallel with the GTO. The reverse conducting GTO device is optimum as such a main switching element for an inverter. Inverters generate AC electric power in front of a square wave pulse train that is derived by switching the DC power source and are used as, e.g., a driving power source of an induction motor serving as a power source of an electric car. In such an inverter, to obtain a good AC waveform with fewer unnecessary harmonic components and less electric power loss, a number of complicated square wave pulses to be combined. Therefore, the switching of the main switching element of the inverter is fairly complicated and particularly in a multiphase inverter such as a three-phase inverter or the like for obtaining a multiphase alternating current, the switching of the main switching element becomes extremely complicated. In addition, in the multiphase inverter, in the case where an output is supplied to an inductive load such as a transformer to synthesize an output or an induction motor, the voltages and currents which are applied to the main switching element of the inverter and to the diode connected in anti-parallel therewith become very complicated.

In the case of using the reverse conducting GTO device in such an inverter, there is a case where a positive voltage is applied to the GTO section, for instance, after the forward current flowed through the diode section in the state whereby the GTO section is off. In such a case, even when the positive voltage is applied to the GTO section, the off state of the GTO section has to be maintained.

FIG. 2 shows a waveform of a voltage $V_A$ which is applied to the GTO section and a waveform of a current $I_D$ flowing through the diode in one example of such a case.

As shown by solid lines in the diagram, the forward current $I_D$ flows through the diode section while the GTO section is in the off state, and after time $t_1$, the positive voltage is applied to the GTO section, so that the applied voltage $V_A$ of the GTO section is recovered. However, in case of the rate of decrease in the current $I_D$ of the diode section is large as indicated by broken lines in the diagram, the GTO section is erroneously ignited after time $t_1$ and the blocking capability could not be maintained. This is because the excessive carriers in the diode section act as a trigger current of the GTO section.

Namely, during the period when the diode current $I_D$ is flowing, positive holes flow from the anode layer 13' in the diode section to the cathode layer 15, while electrons flow from the cathode layer 15 to the anode layer 13', respectively. As shown in FIG. 2, at time $t_1$, the anode-cathode voltage of the GTO section becomes opposite to that before time $t_1$ and the potential on the anode side becomes higher than that on the cathode side. At this time, the excessive electrons existing in the diode section b are drained from the cathode layer 15 in the diode section and the excessive holes are drained from the anode layer 13', respectively. However, the excessive carriers overflowed into the region near the n+ layer 20 formed in the isolation region c and into the GTO section a are not returned to the diode section b. In other words, the excessive electrons pass through the first emitter layer 11 and go out of the anode electrode 18, thereby allowing the positive holes, as many as these excessive electrons, to enter. On one hand, the excessive holes pass through the second base layer 13, gate electrode 17 near the isolation region c and a resistor $R_{GK}$ (not shown) connected between the gate and cathode, and then they are drained to the cathode electrode 16. In the ordinary case, the resistor $R_{GK}$ is connected between the gate and cathode on the outside of the element in order to improve the dv/dt withstanding capacity of the GTO section and to raise the forward withstanding voltage. Thus, the displacement current in association with the recovery of the voltage of the GTO section and the current due to the drain of the excessive holes are added and the resultant added current flows through the resistor $R_{GK}$. When the voltage drop due to the current flowing through the $R_{GK}$ exceeds the minimum gate trigger voltage corresponding to the built-in potential of the junction consisting of the second base layer 13 and second emitter layer 14, the positive holes pass from the second base layer 13 through the second emitter layer 14 and enter the cathode electrode 16, thereby allowing the electrons, as many as these holes, to enter the second base layer 13 from the second emitter layer 14. The GTO is erroneously ignited due to the above-described operation. This misignition can easily occur as a decrease rate $dI_D/dt$ of the diode current $I_D$ becomes large. This is because as the decrease factor $dI_D/dt$ of the diode current $I_D$ becomes large, the residual quantity of the excessive carriers (remaining in the diode section b and in the isolation region c) increases and in particular, the residual quantity of the holes (whose mobility is smaller than that of the electrons) increases.

To avoid such a problem, the width of the isolation region c is generally made wide in order to prevent the excessive carriers in the diode section b from exerting an influence on the GTO section a. However, since the isolation region c completely serves as a dead space with respect to the operations and functions of the GTO section and diode section themselves, when the width of the isolation region c is set to be large, the substantial areas of the GTO section and diode section become small. Consequently, this causes problems such that a large enough current capacity cannot be assured and the on-state voltage becomes large and the like.

SUMMARY OF THE INVENTION

It is an object of the present invention to provide a reverse conducting GTO device in which by allowing the isolation region to be effectively used, the substantial areas of the GTO section and diode section are large and a relatively large current capacity and a low on-state voltage are attained.

In a reverse conducting GTO device which is provided according to the invention, an arrangement such as, for example, a gate electrode or the like that was not arranged in the isolation region portion in existing similar devices is arranged on the isolation region, so that relatively large areas of the GTO section and diode section are obtained.

Generally, in the case of a GTO, in order to derive a good turn-off balance in the respective cathode portions which are divided into a plurality of parts and are operated in parallel with each other and thereby to increase the peak turn-off current (namely, the maximum value of the anode current which can be turned off), it is inevitable to reduce the resistance of the gate electrode in order to efficiently take out the gate current. Thus, in the conventional GTO, the area of the cathode portion serving as the passage of the anode current is merely 25 to 35% of the total area of the GTO. However, according to the invention, larger effective area is obtained, because a part of the gate electrode portion which occupies 60 to 70% of the area of the GTO, typically, the large portions where the gate leads and compression bonded gate come into contact with the gate electrode, are allowed to be arranged in the isolation region of the reverse conducting GTO device, thereby new cathode portion can be generated in the portion which is used as a gate electrode according to the arrangement of an existing GTO. With such a constitution, it is possible to realize the increase in current capacity of the GTO section and the reduction in on-state voltage in the reverse conducting GTO device.

As the result of calculation with regard to the case of the reverse conducting GTO device having a diameter of 60 mm of the order of 1000 A (amperes), it nas been tound that the cathode area can be increased by 20% compared with that in the conventional arrangement. Thus, in the case of the same pellet size, the reverse conducting GTO device of the order of 1200 A can be manufactured.

In addition, according to the present invention, since the gate electrode and the like are arranged on the isolation region which requires a relatively large area, the contact areas of the gate leads and the like for connection with the outside can be made very much larger than those in the case of an existing GTO. Therefore, considering the case where the reverse conducting GTO (according to the present invention) is enclosed in the enveloping, a degree of freedom in the designing of the cathode side electrode is increased and its assembly is made easier.

DETAILED DESCRIPTION OF THE PREFERRED EMBODIMENT

Figure 1:
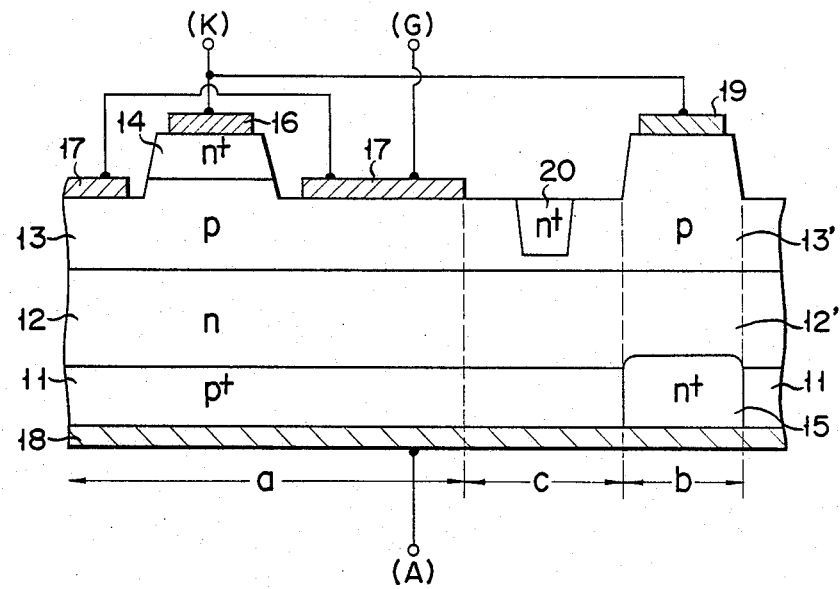
FIG. 1 is a cross sectional view showing diagrammatically an example of a fundamental arrangement of a reverse conducting GTO device.
Figure 2:
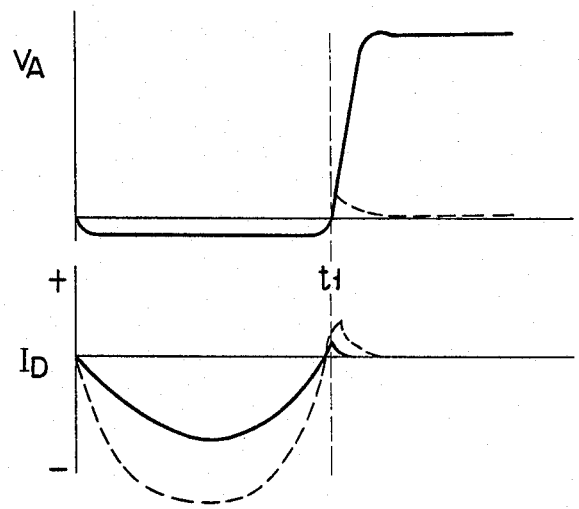
FIG. 2 is a waveform diagram to explain the misignition in the reverse conducting GTO device.

Embodiments of a reverse conducting GTO device according to the present invention will now be described with reference to FIGS. 3 to 16. In FIG. 1 and FIGS. 3 to 16, the same parts and components are designated by the same reference numerals.

Figure 3:
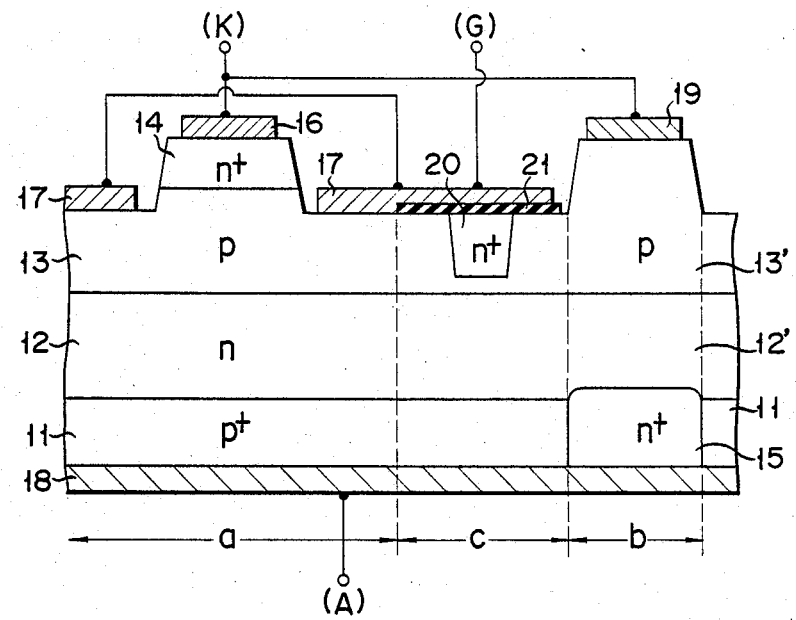
FIG. 3 is a cross sectional view showing diagrammatically an arrangement of the first embodiment of a reverse conducting GTO device according to the present invention.

FIG. 3 shows the first embodiment of a reverse conducting GTO device according to the invention.

In the first embodiment, the gate electrode 17 is arranged in the isolation region c. The gate electrode 17 extends from the GTO section a to the isolation region c and is connected to a gate lead in this portion. This gate lead is connected to the gate terminal G for connection with the outside. The isolation region c corresponds to the region from the end of the diode section b to the portion where the gate electrode 17 in the GTO section a is in contact with the second base layer 13. The gate electrode 17 is electrically separated from the second base layer 13 and n+ layer 20 by an insulation film 21.

Figure 4:
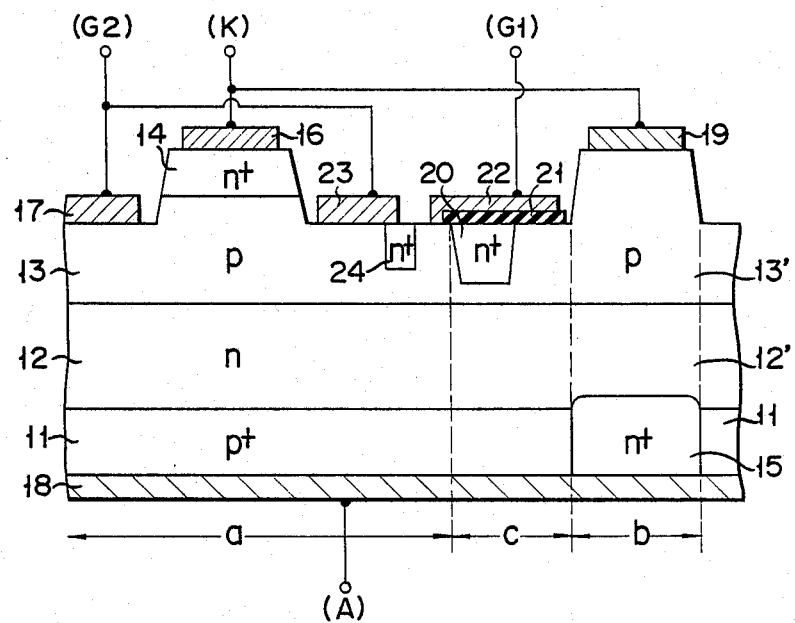
FIG. 4 is a cross sectional view showing diagrammatically an arrangement of the second embodiment of a reverse conducting GTO device according to the invention.

FIG. 4 shows the second embodiment of a reverse conducting GTO device according to the invention.

The second embodiment relates to the embodiment in which the invention is applied to a reverse conducting GTO employed an amplifying gate structure (namely, a structure whereby an auxiliary thyristor is arranged near the gate of a main thyristor and the gate trigger of the main thyristor is performed through the auxiliary thyristor) in which the gate electrode is separated into the gate electrode 17 for turn-off and the gate electrode 22 for turn-on which is provided on the isolation region c. Practically speaking, the insulation film 21 is formed on the second base layer 13 and n+ layer 20 in the isolation region c, while the gate electrode 22 for turn-on is provided on the insulation film 21. A part of the turn-on gate electrode 22 is in contact with the second base layer 13 in the GTO section a. The gate lead which is connected to a first gate terminal G₁ for turn-on is connected to the gate electrode 22. A second emitter layer 24 of an auxiliary GTO is formed in the portion adjacent to the gate electrode 22 in the GTO section a. An auxiliary gate electrode 23 is provided on the second emitter layer 24. The electrode 23 is in contact with both the second base layer 13 and the second emitter layer 24 of the auxiliary GTO, thereby connecting both of these layers. Although it is desirable that the electrode 23 is connected to the gate electrode 17 of a main GTO as shown in the diagram, the electrode 23 and gate electrode 17 are not necessarily connected directly. The gate electrode 17 is connected to a second gate terminal G₂ for turn-off. In this embodiment, the gate electrode 17 is directly connected to the second turn-off gate terminal G₂; however, it is also possible to adopt an arrangement such that the gate electrode 17 is connected to the second gate terminal G₂ through a diode formed monolithically adjacent to the gate electrode 17 (refer to FIG. 6 for an example of a diode formed monolithically adjacent to the gate).

Figure 5:
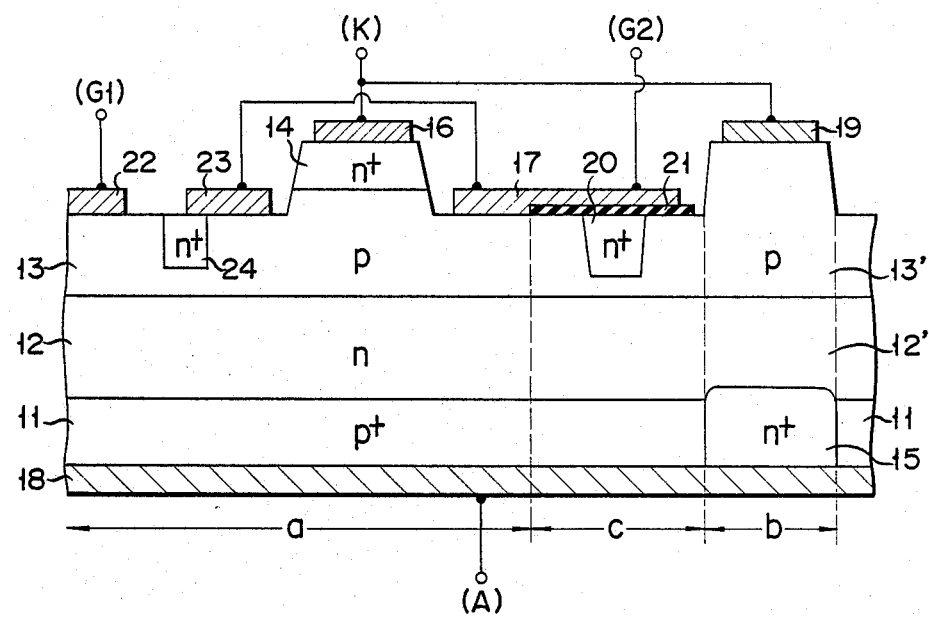
FIG. 5 is a cross sectional view showing diagrammatically an arrangement of the third embodiment of a reverse conducting GTO device according to the invention.

FIG. 5 shows the third embodiment of a reverse conducting GTO device according to the invention.

The third embodiment also relates to the embodiment of which the invention is applied to a reverse conducting GTO in which the gate electrode is separated into the gate electrode for turn-off and the gate electrode for turn-on and an amplifying gate structure is adopted. The turn-off gate electrode 17 is provided on the isolation region c. The gate electrode 17 is formed so as to surround each GTO element which is defined by each segment of the second emitter layer 14. The amplifying gate structure is formed by providing the auxiliary gate electrode 23 and the second emitter layer 24 in the region other than the portion of the gate electrode 17 in the GTO section a.

Figure 6:
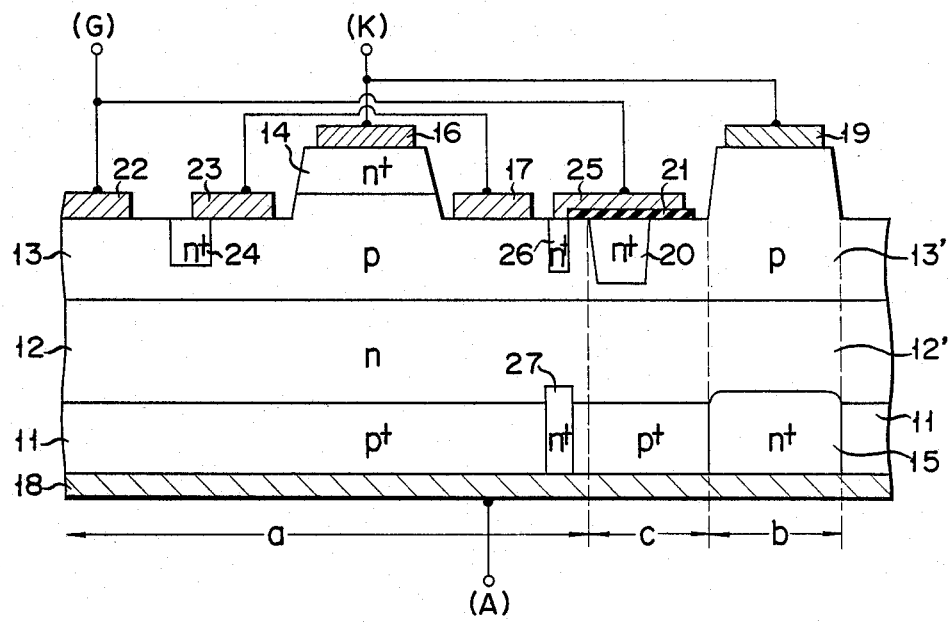
FIG. 6 is a cross sectional view showing diagrammatically an arrangement of the fourth embodiment of a reverse conducting GTO device according to the invention.

FIG. 6 shows the fourth embodiment of a reverse conducting GTO device according to the invention.

The fourth embodiment relates to the embodiment of which the invention is applied to a reverse conducting GTO in which an amplifying gate structure is adopted. A cathode electrode 25 of the auxiliary diode monolithically formed is provided on the isolation region c. Generally, in the GTO in which an amplifying gate structure is adopted, the auxiliary diode is connected between the gate electrode 17 (for turn-off) of the main GTO and the gate electrode 22 (for turn-on) of the auxiliary GTO in order to allow the auxiliary GTO to be certainly turned off. In this embodiment, this auxiliary diode is monolithically formed. Practically speaking, an n+ layer serving as a cathode layer 26 of the auxiliary diode is formed in the second base layer 13 and the auxiliary diode is constituted by the cathode layer 26 and second base layer 13. The electrode 25 for turn-off, which is connected to the cathode layer 26, is electrically connected to the electrode 22 for turn-on and is further connected to the gate terminal G for connection with the outside. An n+ layer 27 is formed on the anode side in the auxiliary diode section monolithically formed for prevention of the parasitic thyristor operation; further, the life time killer is selectively and strongly doped in this portion for prevention of the parasitic transistor operation. On one hand, in a reverse conducting GTO, in order to allow the excessive carriers in the diode section b to be extinguished due to the recombination before they reach the GTO section a, it is effective to selectively and strongly dope the life time killer into only the isolation region c. In this embodiment, the auxiliary diode is monolithically formed adjacent to the isolation region, so that there is an advantage such that both of the above-mentioned doping processes can be simultaneously performed.

Figure 7:
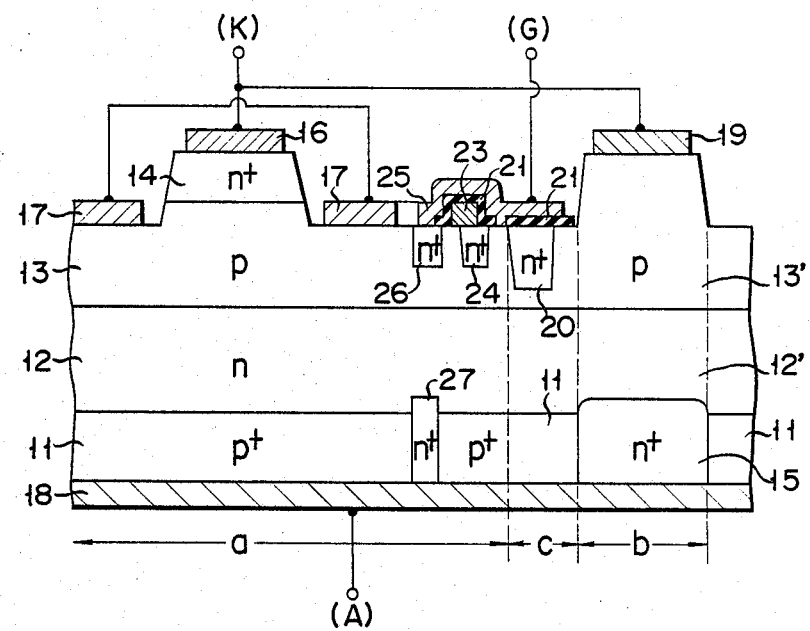
FIG. 7 is a cross sectional view showing diagrammatically an arrangement of the fifth embodiment of a reverse conducting GTO device according to the invention.

FIG. 7 shows the fifth embodiment of a reverse conducting GTO device according to the invention.

The fifth embodiment also relates to the embodiment of which the invention is applied to a reverse conducting GTO in which an amplifying gate structure is adopted. The cathode electrode 25 of the monolithically formed auxiliary diode is formed on the isolation region c integrally with the gate electrode for turn-on. The electrode 23 formed in the auxiliary GTO and the cathode electrode 25 of the monolithically formed auxiliary diode are electrically separated by means of a double layer wiring as shown in the diagram (or by being arranged at a distance in the horizontal direction). The electrode 23 formed in the auxiliary GTO portion is electrically connected to the gate electrode 17 to strengthen the effect of the auxiliary GTO.

In the foregoing embodiments, the horizontal arrangement of the GTO section a and diode section b may be set to any positional relation. In addition, for the structures of those sections a and b, any other existing structure than the structures shown so far, for instance, an anode short structure or the like may be adopted and components and elements in the amplifying gate structure may be properly modified. On the other hand, as already mentioned above, the n+ layer 20 formed in the isolation region c may be replaced by a gap portion, for example, a groove or by a dielectric material or the like. Also, the second base layer 13 in the GTO section a and the anode layer 13' in the diode section b may be completely separated by means of, e.g., selective diffusion or the like. Further, although the gate lead which is connected to the gate terminal for the outside connection is connected to the electrode formed on the isolation region c, the gate lead is not necessarily connected to this portion, but the gate lead can be connected by way of various kinds of methods such as a compression bonding or the like as well as the ordinary bonding method.

Figure 8:
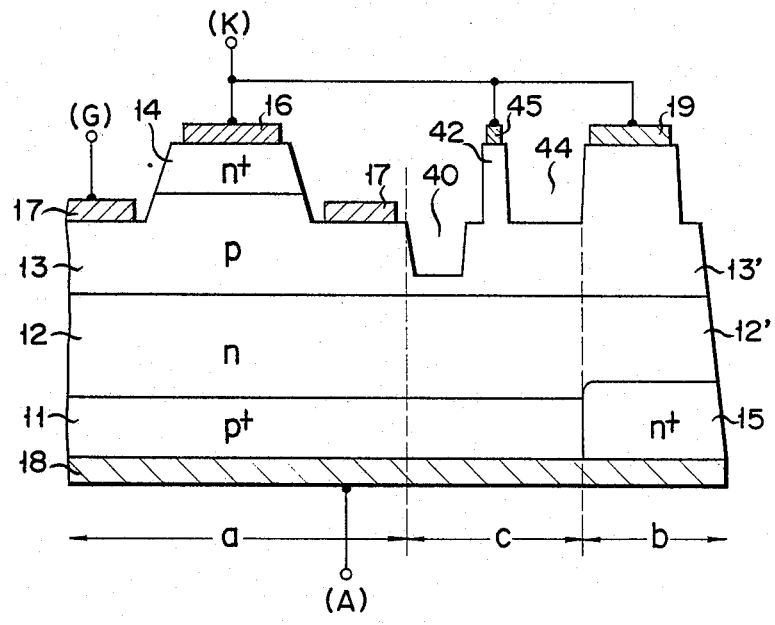
FIG. 8 is a cross sectional view showing diagrammatically an arrangement of the sixth embodiment of a reverse conducting GTO device according to the invention.

FIG. 8 shows the sixth embodiment of a reverse conducting GTO device according to the invention.

The sixth embodiment relates to the embodiment in which a drain region 42 is provided in the isolation region c, in order to drain the excessive holes overflowed from the diode section b to the cathode electrode 16 without passing through the base layer in the GTO section a. A drain electrode 45 of the drain region 42 is also apparently provided in the isolation region c. In this embodiment, a groove 40 is formed in place of the n+ layer 20 which is formed in the isolation region c. The drain region 42 consists of the same p-type layer as the anode layer 13' in the diode section b and is formed by forming a groove 44 in the region between the drain electrode 45 and the anode electrode 19. The drain electrode 45 is electrically connected to the anode electrode 19 and to the cathode electrode 16 in the GTO section a. The potential of the drain region 42 is maintained to be equal to that of the anode layer 13'.

In this embodiment, the excessive holes overflowed from the diode section b are drained through the drain region 42 to the cathode electrode 16, so that the misignition due to the excessive holes is effectively prevented. Also, since the misignition hardly occurs, due to the provision of the drain region 42, the width of the isolation region can be also narrowed.

Figure 9:
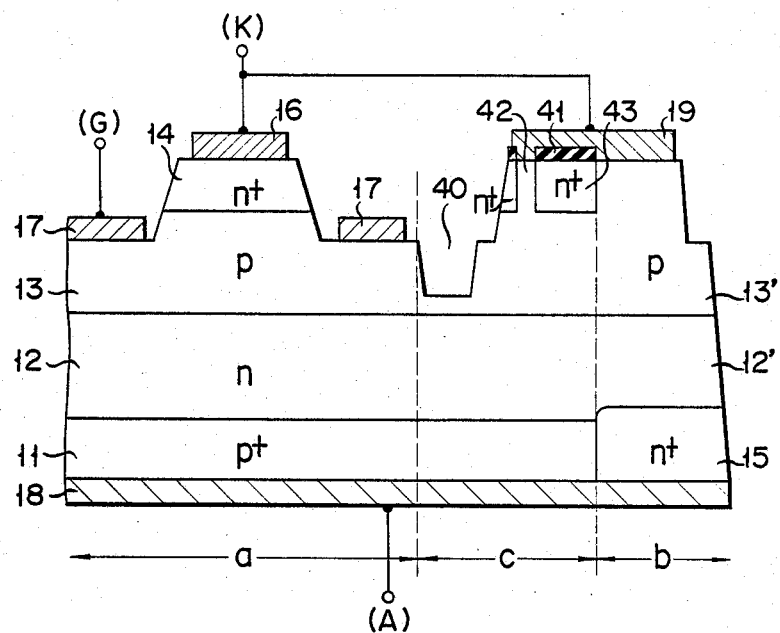
FIG. 9 is a cross sectional view showing diagrammatically an arrangement of the seventh embodiment of a reverse conducting GTO device according to the invention.

FIG. 9 shows the seventh embodiment of a reverse conducting GTO device according to the invention.

The seventh embodiment also relates to the embodiment in which the drain region 42 is provided in the isolation region c, in order to drain the excessive holes overflowed from the diode section b to the cathode electrode 16 without passing through the base layer in the GTO section a. In this embodiment as well, the groove 40 is formed in place of the n+ layer 20 which is formed in the isolation region c. The drain region 42 which is provided in the isolation region c is formed by selectively diffusing an n+-type layer 43 in the portions on both sides of the drain region 42. The drain electrode of the drain region 42 is integrated with the anode electrode 19 in the diode section b and the potential of the drain region 42 is held to be equal to that of the anode layer 13' due to the anode electrode 19. Since the lower side of the n+-type layer 43 becomes the pnpn structure, in order to prevent the latch up of this portion, the surface of the n+-type layer 43 which faces the anode electrode 19 is covered by an insulation film 41.

An example in the case where this embodiment is practically embodied will now be mentioned. The first emitter layer 11 of the GTO is diffused so as to have a surface impurity concentration of $1.0 \times 10^{18}/cm^3$ and a diffusion depth of 50 $\mu$m. The first base layer 12 is formed to have an impurity concentration of $6.5 \times 10^{13}/cm^3$ and a thickness of 250 $\mu$m. The second base layer 13 is diffused to have a surface impurity concentration of $1 \times 10^{18}/cm^3$ and a diffusion depth of 50 $\mu$m. The second emitter layer 14 is diffused to have an impurity concentration of over $10^{19}/cm^3$ and a diffusion depth of 10 $\mu$m. The cathode layer 15 in the diode section b has a surface impurity concentration of $2.0 \times 10^{19}/cm^3$ and a diffusion depth of 70 $\mu$m. The anode layer 13' is diffused simultaneously with the second base layer 13 in the GTO section a. The n+-type layer 43 to derive the drain region 42 is diffused simultaneously with the second emitter layer 14 in the GTO section a.

In this example, the width of the isolation region c is 500 $\mu$m and the width $d_s$ of the n+-type layer 43 is 200 $\mu$m.

Thus, the area of the drain region 42 is below 20% of the area of the diode section b. In this case, the current flowing through the drain region 42 has a small value less than 1% of the diode current and the drain region 42 substantially functions only to drain the excessive carriers. In order to have the misignition preventing function that is almost equivalent to this example in the arrangement without the drain region 42, 1.2 mm is needed as the width of the isolation region c. Therefore, the width of the isolation region c in this example becomes below ½ of that in the arrangement without the drain region 42.

In the sixth and seventh embodiments, if the life time killer is doped in the isolation region, the device can safely operate even for a further large $dI_D/dt$.

Figure 10:
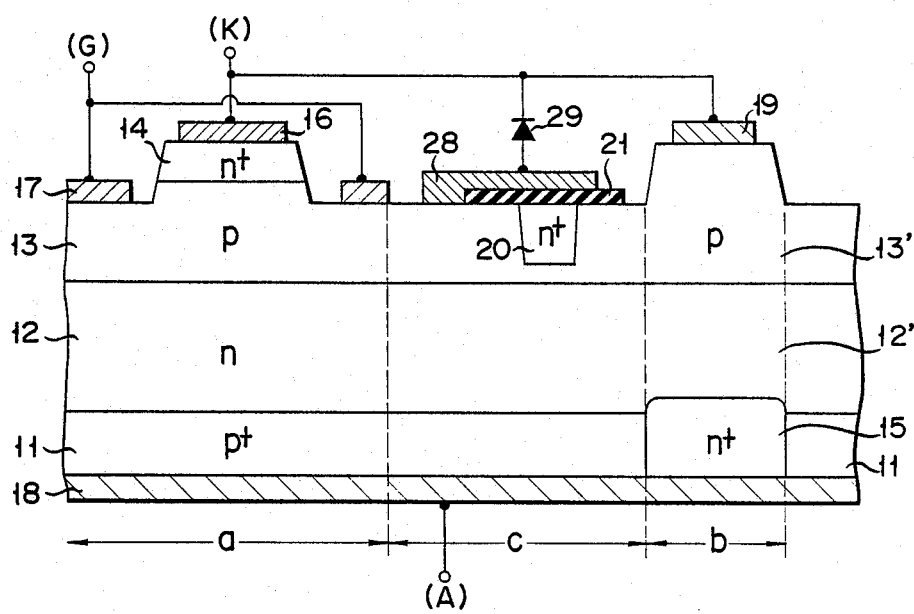
FIG. 10 is a cross sectional view showing diagrammatically an arrangement of the eighth embodiment of a reverse conducting GTO device according to the invention.

FIG. 10 shows the eighth embodiment of a reverse conducting GTO device according to the invention.

The eighth embodiment relates to the embodiment in which a diode 29 is provided to bypass the excessive holes overflowed from the diode section b. An electrode 28 to which the lead that is connected to the anode of the diode 29 is connected is provided in the isolation region c. The electrode 28 is provided separately from the gate electrode 17 which comes into low resistance contact with the gate layer (second base layer 13) in the GTO section a.

In this embodiment, the lead line which is connected to the diode 29 is led out from the isolation region c, so that the substantial areas of the GTO section a and diode section b can be enlarged.

Figure 11:
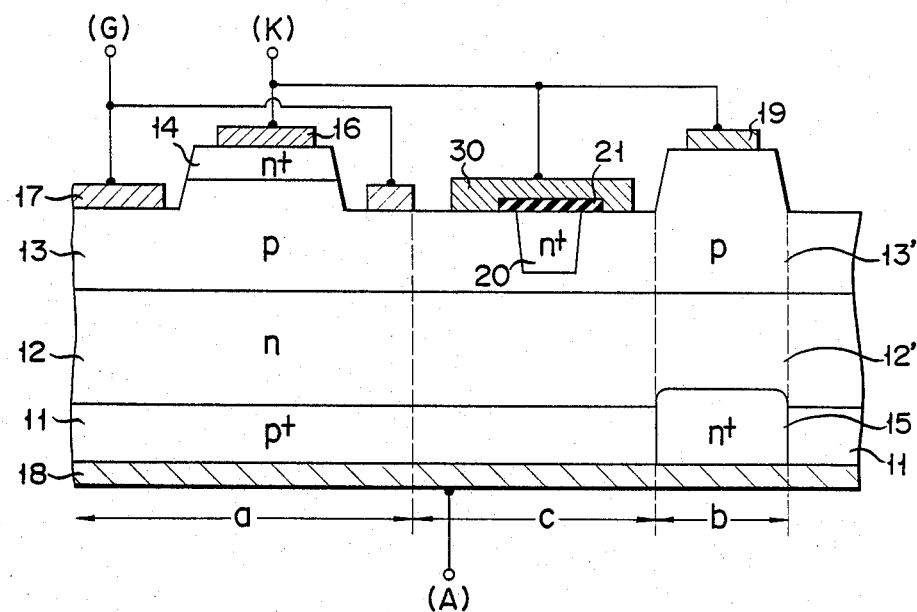
FIG. 11 is a cross sectional view showing diagrammatically an arrangement of the ninth embodiment of a reverse conducting GTO device according to the invention.

FIG. 11 shows the ninth embodiment of a reverse conducting GTO device according to the invention.

In the ninth embodiment, a diode for bypass which has a purpose similar to that of the diode 29 in the eighth embodiment shown in FIG. 10 is monolithically formed. Namely, to efficiently take out the excessive holes, an electrode 30 constituting a Schottky diode between the second base layer 13 and the electrode 30 is formed in the isolation region c. The electrode 30 is also separated from the gate electrode 17. The electrode 30 and cathode electrode 16 may be connected by means of a bonding method or by an Al electrode.

According to this embodiment, since the forward voltage drop of the Schottky diode is determined only by a potential barrier at the interface of the semiconductor and the metal, the forward voltage drop of the Schottky diode can be reduced to be substantially lower than that of the pn junction diode. Thus, it is possible to effectively drain any excessive holes.

Figure 12:
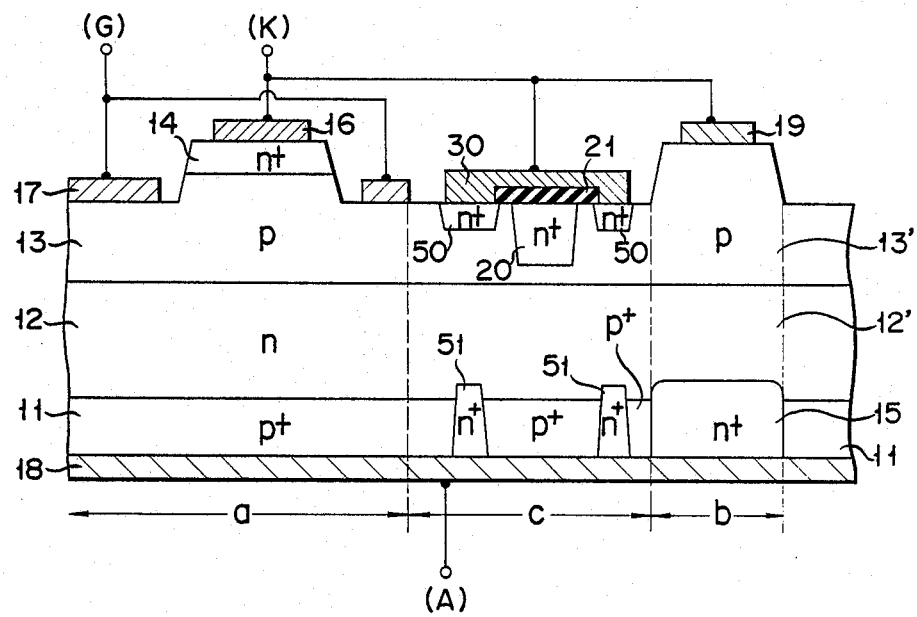
FIG. 12 is a cross sectional view showing diagrammatically an arrangement of the tenth embodiment of a reverse conducting GTO device according to the invention.

FIG. 12 shows the tenth embodiment of a reverse conducting GTO device according to the invention.

In the tenth embodiment as well, the diode for bypass is monolithically formed similarly to the ninth embodiment; however, in this case, the bypass diode is formed by diffusing an $n^+$-type layer 50.

The $n^+$ layer 51 is formed on the anode side of the bypass diode section for prevention of the parasitic thyristor operation. In addition, a possible parasitic transistor operation can also be prevented by selectively and highly doping the life time killer in the bypass diode section.

Figure 13:
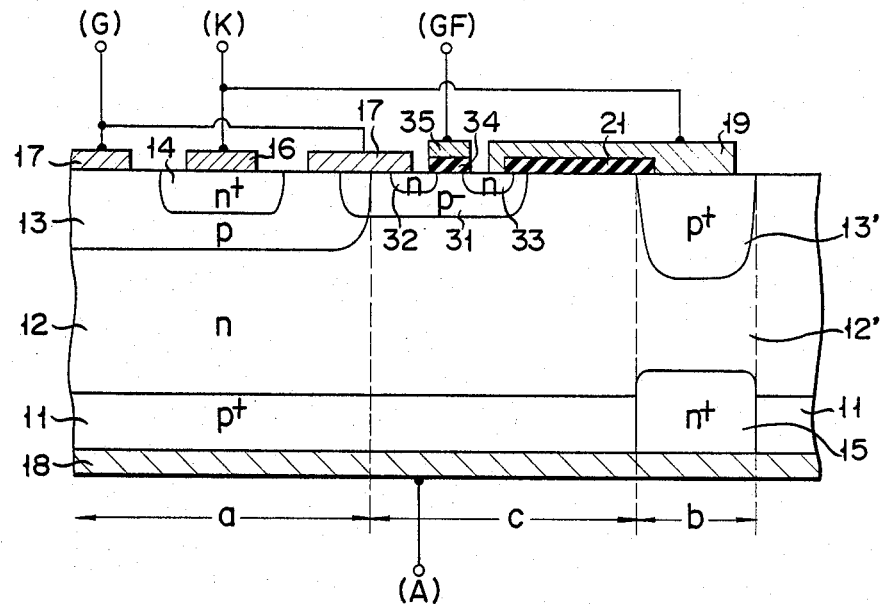
FIG. 13 is a cross sectional view showing diagrammatically an arrangement of the eleventh embodiment of a reverse conducting GTO device according to the invention.

FIG. 13 shows the eleventh embodiment of a reverse conducting GTO device according to the invention.

The eleventh embodiment relates to the embodiment in which a MOSFET which is inserted between the gate electrode 17 and cathode electrode 16 in the GTO section a is integrally formed. A $p^-$-type layer 31 is formed in the isolation region c and n-type layers 32 and 33 serving as a source and a drain are respectively formed in the $p^-$-type layer 31. A gate electrode 35 is formed on an insulation film 34 between the n-type layers 32 and 33. The gate electrode 17 is connected to the n-type layer 32, while the anode electrode 19 in the diode section b is connected to the n-type layer 33. The anode electrode 19 is connected to the cathode electrode 16. These commonly connected anode electrode 19 and cathode electrode 16 are connected to the cathode terminal K. The gate electrode 35 of the MOSFET is connected to the gate terminal $G_F$.

According to this embodiment, it is possible to obtain the reverse conducting GTO device which can be turn-off controlled by the MOSFET with hardly causing an increase in area due to the formation of the MOSFET.

Figure 14:
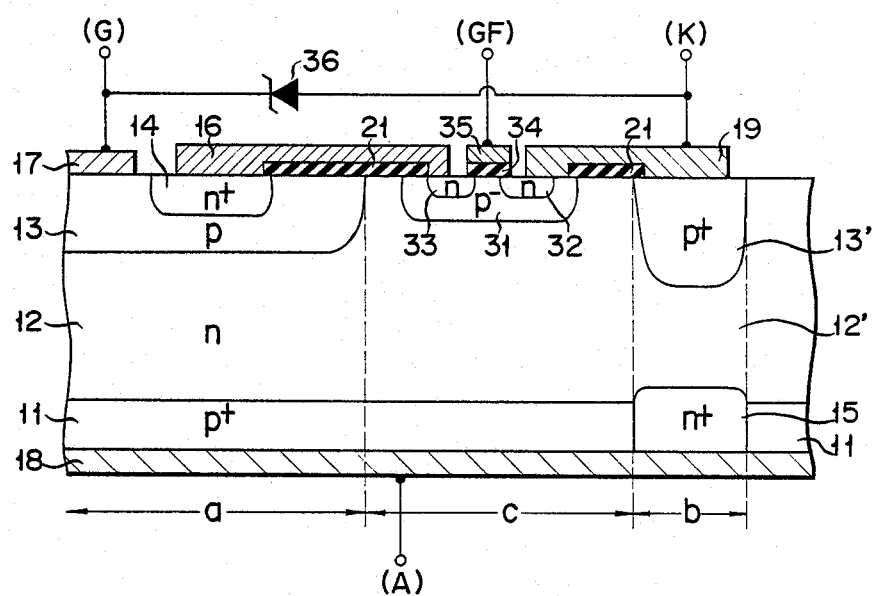
FIG. 14 is a cross sectional view showing diagrammatically an arrangement of the twelfth embodiment of a reverse conducting GTO device according to the invention.

FIG. 14 shows the twelfth embodiment of a reverse conducting GTO device according to the invention.

The twelfth embodiment relates to the embodiment in which a MOSFET, tor emitter-opening, connected to the GTO section a is integrated. The structure of the MOSFET is similar to the case of the eleventh embodiment. A Zener diode 36 which is connected between the electrodes 17 and 19 is provided to suppress the voltage between the source and drain of the MOSFET. The cathode electrode 16 is not connected to the cathode terminal K but comes into contact with the n-type layer 33 of the MOSFET. The cathode electrode 16 is electrically separated from the p-type layers 13, 31 and the n-type layer 12 by the insulation film 21. The cathode terminal K is connected to the electrode 19.

In this embodiment as well, the MOSFET can be integrated without causing an increase in area.

Figure 15:
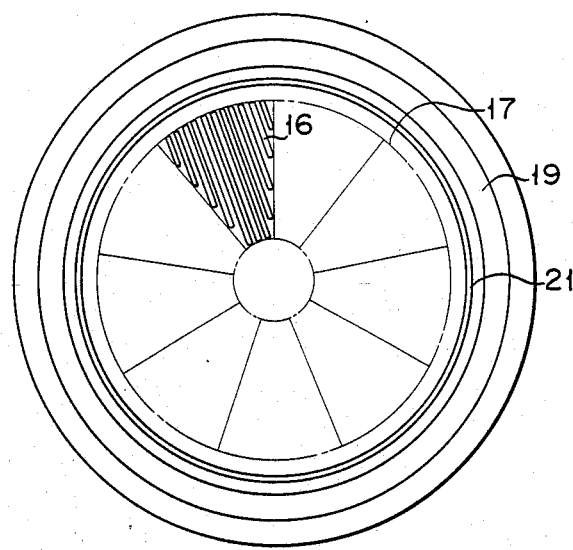
FIG. 15 is a plan view showing diagrammatically an arrangement of electrodes in the thirteenth embodiment of a reverse conducting GTO device according to the invention.

FIG. 15 shows the thirteenth embodiment of a reverse conducting GTO device according to the invention.

The thirteenth embodiment relates to the embodiment in which an emitter pattern is devised to further increase the effective area of the GTO. Although the radial emitter pattern (refer to FIG. 16) has been adopted in the existing GTO, in this embodiment, the circular GTO region is divided into a plurality of sector-like regions like the cathode electrode 16 shown in the diagram and a parallel band-like emitter is formed in every sector-like region.

With this pattern, the effective area of the GTO is increased by about 10% as compared with the radial pattern, so that the remarkable increase in effective area is accomplished with the aid of the double effect in addition to the increase in effective area by way of the use of the isolation region c.

Figure 16:
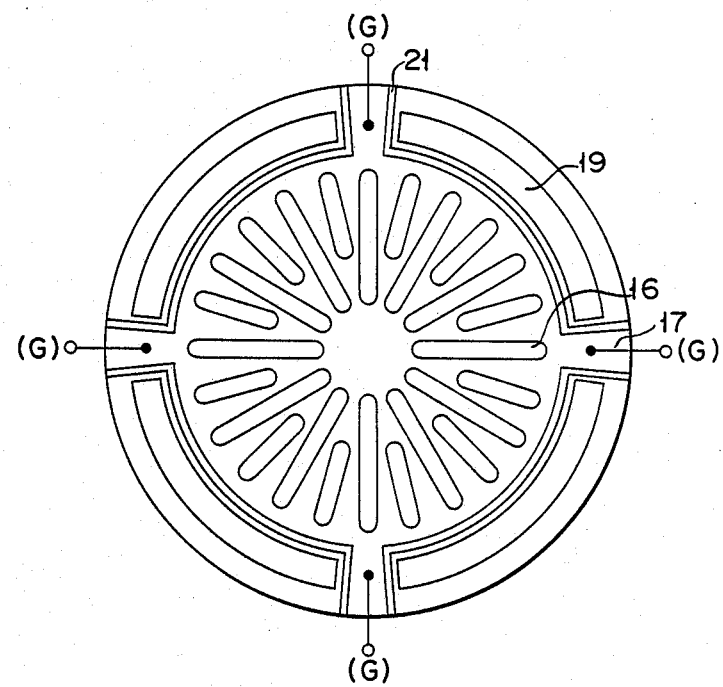
FIG. 16 is a plan view showing diagrammatically an arrangement of electrodes in the fourteenth embodiment of a reverse conducting GTO device according to the invention.

FIG. 16 shows the fourteenth embodiment of a reverse conducting GTO device according to the invention.

In the fourteenth embodiment, the diode section which is formed around the GTO section is divided into a plurality of parts and a connection is made from the regions among those divided diode sections to the gate terminals G.

The present invention intends to effectively use the portion on the isolation region in the reverse conducting GTO device; therefore, still another electrode may be provided in this portion or another device may be integrated using this portion.

What is claimed is:

1. A reverse conducting gate turnoff thyristor device comprising:

a semiconductor wafer;

a gate turn-off thyristor section formed in said semiconductor wafer having a gate electrode and constituting a gate turn-off thyristor;

a reverse conduction diode section formed in said semiconductor wafer and near said gate turn-off thyristor and constituting a diode connected in antiparallel with said gate turn-off thyristor section;

an isolation region which is a p-type layer formed in a region that is sandwiched by said gate turn-off thyristor section and said reverse conduction diode section in said semiconductor wafer;

separating means formed by one of a groove and an n-type region provided in said p-type layer of said isolation region; and an insulation film is formed on said, separating means said gate electrode extending over said insulation film.

2. A reverse conducting gate turn-off thyristor device comprising:

a semiconductor wafer;

a gate-turn-off thyristor section formed in said semiconductor wafer, having a p-type base layer and gate electrode, and constituting a gate turn-off thyristor;

a reverse conduction diode section formed in said semiconductor wafer and near said gate turn-off thyristor, having p-type anode layer connected with said p-type base layer of said gate turn-off thryistor section, and constituting a diode connected in anti-parallel with said gate turn-off thyristor section;

an isolation region which is a p-type layer and formed in a region that is sandwiched by said gate turn-off thyristor section and said reverse conduction diode section in said semiconductor wafer;

separating means comprising one of a groove and an n-type region provided in said p-type layer of said isolation region, for separating said p-type base layer of said gate turn-off thyristor section from said p-type anode layer of said reverse conduction diode; and an insulation film formed on said separating means, said gate electrode extending over said insulation film.

3. A reverse conducting gate turn-off thyristor device in which a gate turn-off thyristor having a plurality of cathode regions radially extending and a reverse conduction diode are integrally formed in the same semiconductor wafer, wherein a separating means is provided in an isolation region that is sandwiched by a gate turn-off thyristor section and a reverse conduction diode section, said isolation region being a p-type layer, and said separating means being formed by one of a groove and an n-type region provided in said p-type layer, and an insulation film is formed on said separating means, and a gate electrode of said gate turn-off thyristor section extends over said insulation film.

4. A device according to claim 3 wherein said gate turn-off thyristor section has an amplifying gate structure and said gate electrode is a gate electrode for turn-on control.

5. A device according to claim 3, wherein said gate turn-off thyristor section has an amplifying gate structure and said gate electrode is a gate electrode for turn-off control.

6. A device according to claim 1, wherein said gate turn-off thyristor section has amplifying gate structure, and said gate electrode is a gate electrode for turn-on control.

7. A device according to claim 1, wherein said gate turn-off thyristor section has an amplifying gate structure, and said gate electrode is a gate electrode for turn-off control.

* * * * *